United States Patent [19]

Yeager

[11] Patent Number: 4,573,176
[45] Date of Patent: Feb. 25, 1986

[54] FRACTIONAL FREQUENCY DIVIDER

[75] Inventor: Richard O. Yeager, Camden, N.J.

[73] Assignee: RCA Corporation, Princeton, N.J.

[21] Appl. No.: 553,246

[22] Filed: Nov. 18, 1983

[51] Int. Cl.$^4$ ............................................. H03K 23/48
[52] U.S. Cl. .......................................... 377/48; 377/50
[58] Field of Search ...................... 377/48, 47; 328/15, 328/25; 331/51, 53

[56] References Cited

U.S. PATENT DOCUMENTS

| | | | |
|---|---|---|---|
| 3,446,947 | 5/1969 | Overstreet, Jr. | 377/48 |
| 3,769,597 | 10/1973 | Mayer | 328/15 |
| 4,399,549 | 8/1983 | Srivastava | 377/108 |
| 4,406,014 | 9/1983 | Doron | 377/107 |
| 4,409,564 | 10/1983 | Lo | 331/16 |
| 4,423,381 | 12/1983 | Stepp et al. | 377/48 |
| 4,468,632 | 8/1984 | Crowley | 331/14 |
| 4,468,797 | 8/1984 | Shin | 337/52 |

FOREIGN PATENT DOCUMENTS

| | | | |
|---|---|---|---|
| 33734 | 11/1981 | Japan | 377/47 |
| 18129 | 1/1982 | Japan | 377/47 |
| 2095444 | 9/1982 | United Kingdom | 377/48 |

Primary Examiner—John S. Heyman
Assistant Examiner—Karl Ohralik
Attorney, Agent, or Firm—Joseph S. Tripoli; Robert L. Troike; Christopher L. Maginniss

[57] ABSTRACT

A fractional divider which functions as a prescaler in a phase lock loop-based frequency synthesizer provides a selectable prescaling factor to the divide-by-N programmable divider. The prescaling factor can assume either the value 2 or $2+1/N$. The fractional division, occurring in front of the programmable divider, permits a periodic signal to be generated by that device, while recapturing the frequencies lost to prescaling. When operating in the divide-by-$(2+1/N)$ mode, the fractional divider drops one input clock pulse each time the output signal of the programmable divider assumes a predetermined binary state.

14 Claims, 4 Drawing Figures

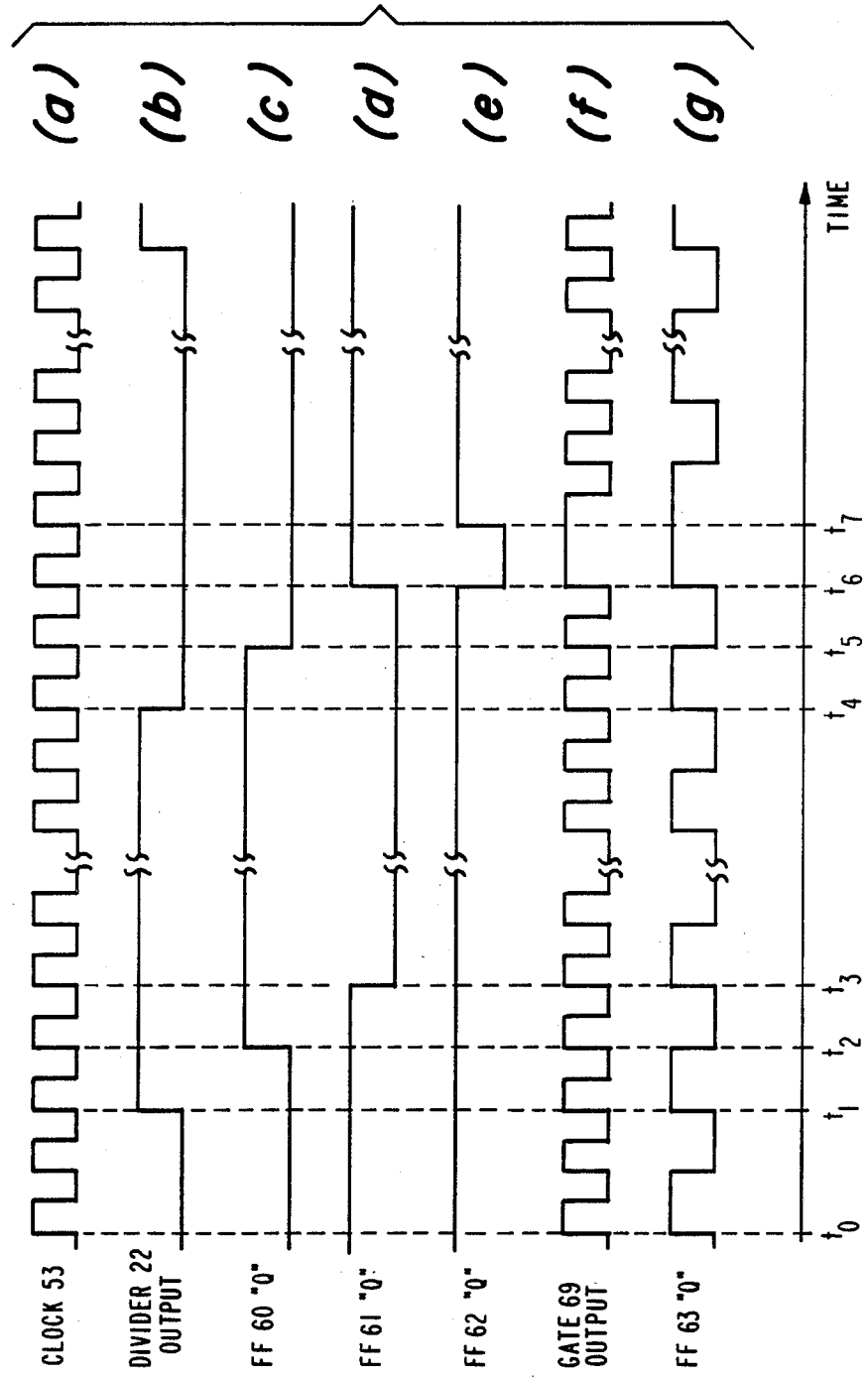

FRACTIONAL FREQUENCY DIVIDER

The Government has rights in this invention pursuant to Contract No. F30602-82-C-0090 awarded by the Department of the Air Force.

This invention relates generally to frequency synthesizers and, more particularly, to a fractional divider for use in a phase locked loop frequency synthesizer.

A typical phase locked loop frequency synthesizer includes a reference source providing a signal at a first frequency and a voltage-controlled oscillator providing a signal at a second higher frequency. The frequency of the VCO output signal is divided by an integral value and this frequency-divided signal is compared with the reference signal in a phase detector. The ratio of the frequency of the VCO output signal to the frequency of the reference signal is the division factor of the divider circuit.

This type of frequency synthesizer provides very precise high frequency signals of a type readily suited for frequency hopping communications systems applications. Frequency hopping systems require the ability to generate a multiplicity of carrier frequency signals, and to switch, or "hop," from one frequency to another at a typical rate of 1 KHz. This relatively high hopping rate necessitates the use of a programmable divider which, under the control of signal generated by a process controller, such as a microprocessor, selectably divides the frequency of an input signal by any integral value within the limits of the divider.

Programmable dividers are, however, complex digital logic devices with relatively long propagation delays and settling times. As such, they are inherently incapable of handling frequencies of a magnitude typically employed in frequency hopping systems, for example, 500–750 MHz. At present, a typical high-speed programmable divider has an upper frequency limit at around 250 MHz.

The frequency limitation of the programmable divider has been overcome in current frequency synthesizers by the use of prescalers—fixed binary dividers using elementary high-speed logic elements. These prescalers divide the frequency of the VCO output signal down to a range capable of being handled by a programmable divider. There is a cost, however, associated with the use of these fixed prescalers in that they reduce, by the prescaling factor, the number of different selectable frequencies which can be synthesized. In terms of a frequency hopping communications system, this results in wider channel spacing and fewer available channels.

In order to overcome this penalizing effect, external circuitry has been added to programmable dividers to enable them to divide alternately by N and N+1, producing an overall effect of division by N+½, thereby doubling the number of frequencies available for use and recapturing some of the frequencies lost to prescaling. Whereas the overall effect produced by this combination is division by N+½, the effect on the phase detector is a sequence of unequally-spaced pulses, resulting in phase modulation of the VCO, thereby creating spurious sidebands.

The present invention overcomes the problems associated with the unequally-spaced pulses applied to the phase detector caused by fractional division within the programmable divider by providing fractional division on the input side of the programmable divider.

In accordance with the principles of the present invention, an apparatus is disclosed which is responsive to an input clock signal of frequency f for generating periodic pulses of frequency $f/(2N+1)$, where N is an integer. The apparatus comprises a first divider means having an input terminal and an output terminal for providing at the output terminal a signal comprising periodic pulses at a frequency which is the Nth division of the frequency of a signal applied at its input terminal. The apparatus further includes a second divider means for generating an output signal of frequency $f/(2+1/N)$. The second divider means includes a divide-by-two circuit and an inhibiting circuit. The divide-by-two circuit has first and second input terminals an an output terminal. The divide-by-two circuit is responsive at its first input terminal to particular transitions of the input clock signal for generating transitions of the signal at its output terminal. The inhibiting circuit is responsive to particular transitions of the signal comprising periodic pulses for generating inhibiting signal pulses. The divide-by-two circuit is responsive at its second input terminal to the inhibiting signal, such that each of the inhibiting signal pulses prevents one of the particular transitions of the input clock signal from generating a transition of the signal at the output terminal of the divide-by-two circuit. Finally, the apparatus comprises a means for coupling the output signal provided by the second divider means to the input terminal of the first divider means.

Other features and advantages of the present invention will be more fully understood from the following detailed description of the preferred embodiment, the appended claims, and the accompanying drawings, in which:

FIG. 4 is a series of timing diagrams useful in explaining the operation of the fractional divider of FIG. 3.

Figure 1:
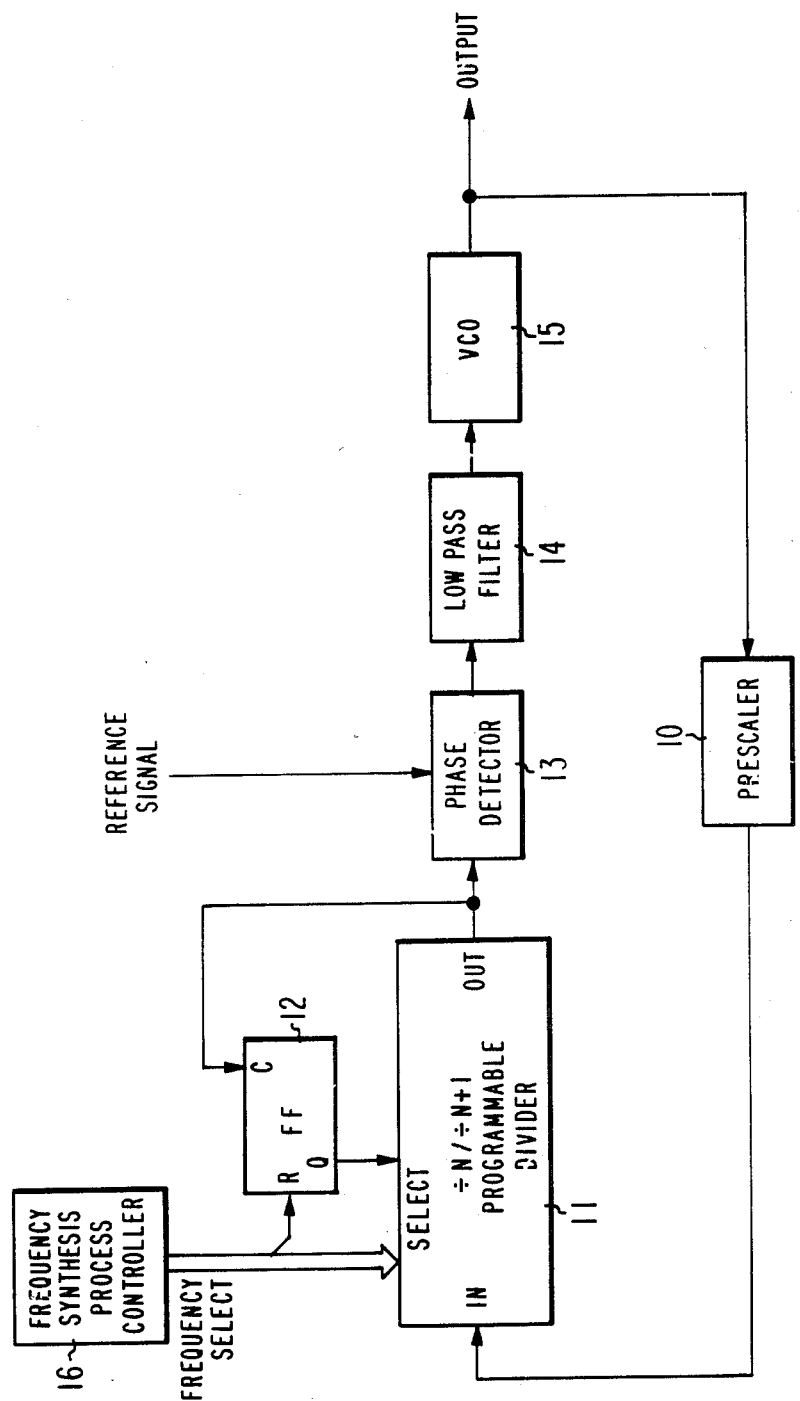
FIG. 1 is a block diagram of a phase locked loop frequency synthesizer according to the prior art.

Referring to FIG. 1, there is illustrated one prior art apparatus for synthesizing frequencies using a phase lock loop to generate specific frequency multiples of an input reference signal frequency. The reference signal is applied to phase detector 13 which compares the reference signal frequency with the frequency of the output signal generated by programmable divider 11. The output signal of phase detector 13 is filtered by low pass filter 14 and applied as the control voltage signal to voltage-controlled oscillator (VCO) 15. The frequency of the output signal generated by VCO 15 is determined by the level of its input control voltage.

The oscillator 15 output signal is fed back to prescaler 10, a fixed binary frequency dividing network which divides the oscillator 15 output signal frequency to a value capable of being handled by programmable divider 11. Divider 11 performs a divide-by-N function on the frequency of the signal applied to it by prescaler 10. The output signal of programmable divider 11 is applied to phase detector 13, as indicated above.

The value of the division factor, N, of programmable divider 11, is determined by the FREQUENCY SELECT signals applied to its SELECT input terminals by frequency synthesis process controller 16.

Flip-flop 12, responsive to the output signal generated by programmable divider 11, provides a control signal to one SELECT input terminal of divider 11 to modify its division factor to N+1 on alternate counts. Flip-flop 12 is configured in a toggle mode so that it sets and resets alternately on each clocking edge of the signal generated by divider 11. The output signal provided by flip-flop 12 is coupled to the least significant SELECT bit of divider 11 so that alternating division factors of N and N+1 are effected. When no alternating division factors are required, flip-flop 12 is held reset by a FREQUENCY SELECT signal applied to its reset (R) input terminal.

As mentioned earlier, the alternation of divide-by-N and divide-by-(N+1) provides an overall divide-by-(N+½) effect, thereby decreasing the channel spacing between usable frequencies and effectively doubling the number of frequencies which this system would otherwise be capable of generating, given the frequency-handling limitation of programmable divider 11. Nevertheless, the deleterious phase modulation of VCO 15, causing spurious sidebands, as a result of the alternation of frequencies generated by divider 11, make this an undesirable system in frequency hopping applications.

Figure 2:
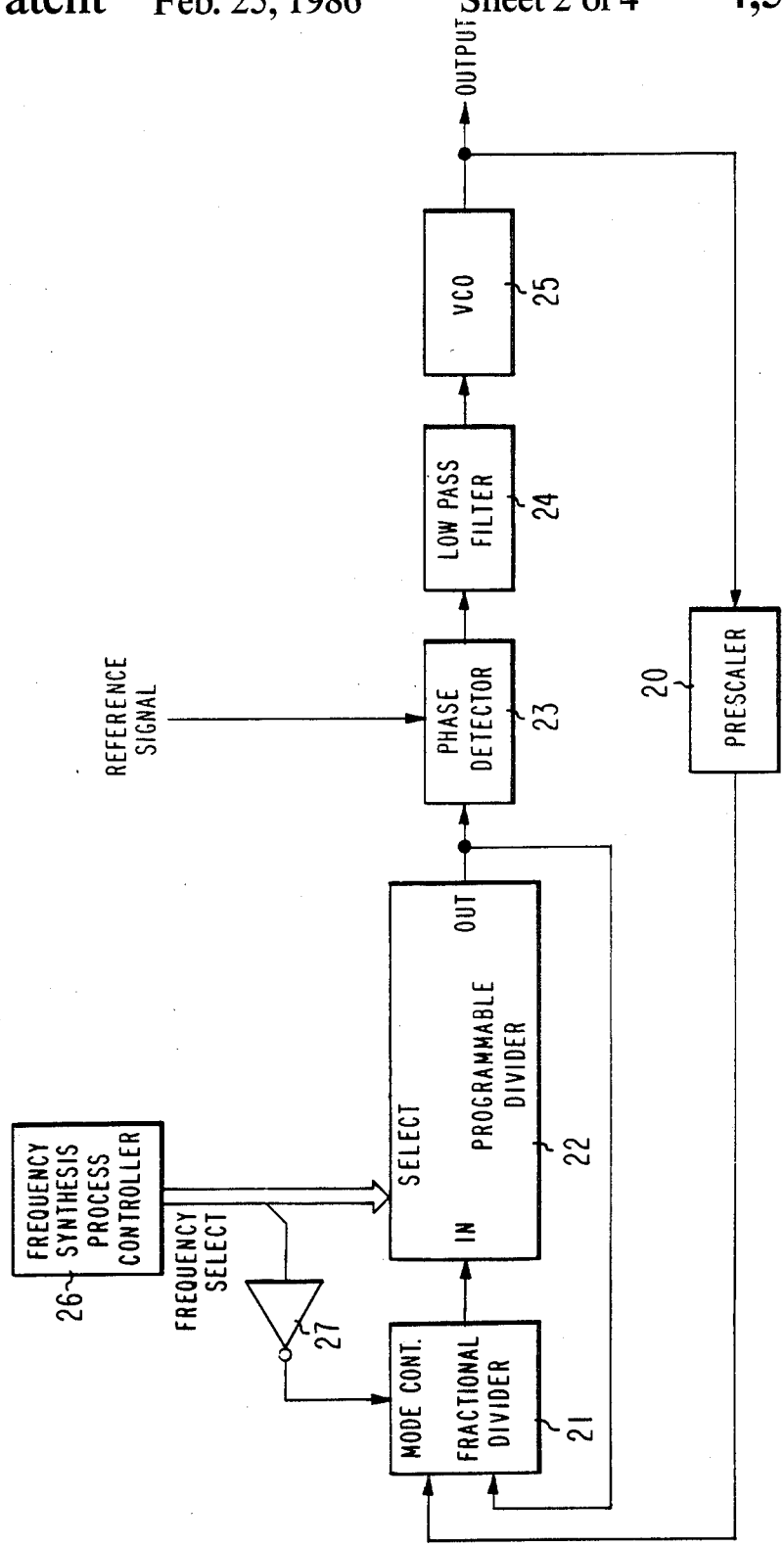
FIG. 2 is a block diagram of a phase locked loop frequency synthesizer according to a preferred embodiment of the present invention.

FIG. 2 illustrates a phase locked loop frequency synthesizer according to the present invention. A reference signal is applied to phase detector 23 which compares the reference signal frequency with the frequency of the signal generated by programmable divider 22. Phase detector 23 outputs an error signal based on this comparison which is applied to low pass filter 24. The filtered error signal is the control voltage which is applied to voltage-controlled oscillator (VCO) 25 and which determines the frequency of the oscillator output signal.

The VCO 25 output signal is fed back into a frequency dividing system comprising elements 20, 21 and 22. Prescaler 20 divides the VCO 25 output signal frequency to a value no greater than twice the frequency-handling capability of programmable divider 22. The prescaler 20 output signal is applied to fractional divider 21 which divides this signal frequency in half and passes its output signal to programmable divider 22. Divider 22 performs a divide-by-N function on the frequency of its input signal. The output signal of programmable divider 22 is applied to phase detector 23, as indicated above, and, in addition, is fed back into fractional divider 21 so that the latter device can selectably perform a divide-by-(2+1/N) function.

The value of the division factor, N, of programmable divider 22 is determined by the FREQUENCY SELECT signals applied to its SELECT input terminals, which signals are generated by frequency synthesis process controller 26. In addition, one of the FREQUENCY SELECT signals is applied, through logic inverter 27, to the MODE CONTROL input terminal of fractional divider 21 to thereby selectably determine, as between 2 and 2+1/N, the division factor of divider 21.

Figure 3:
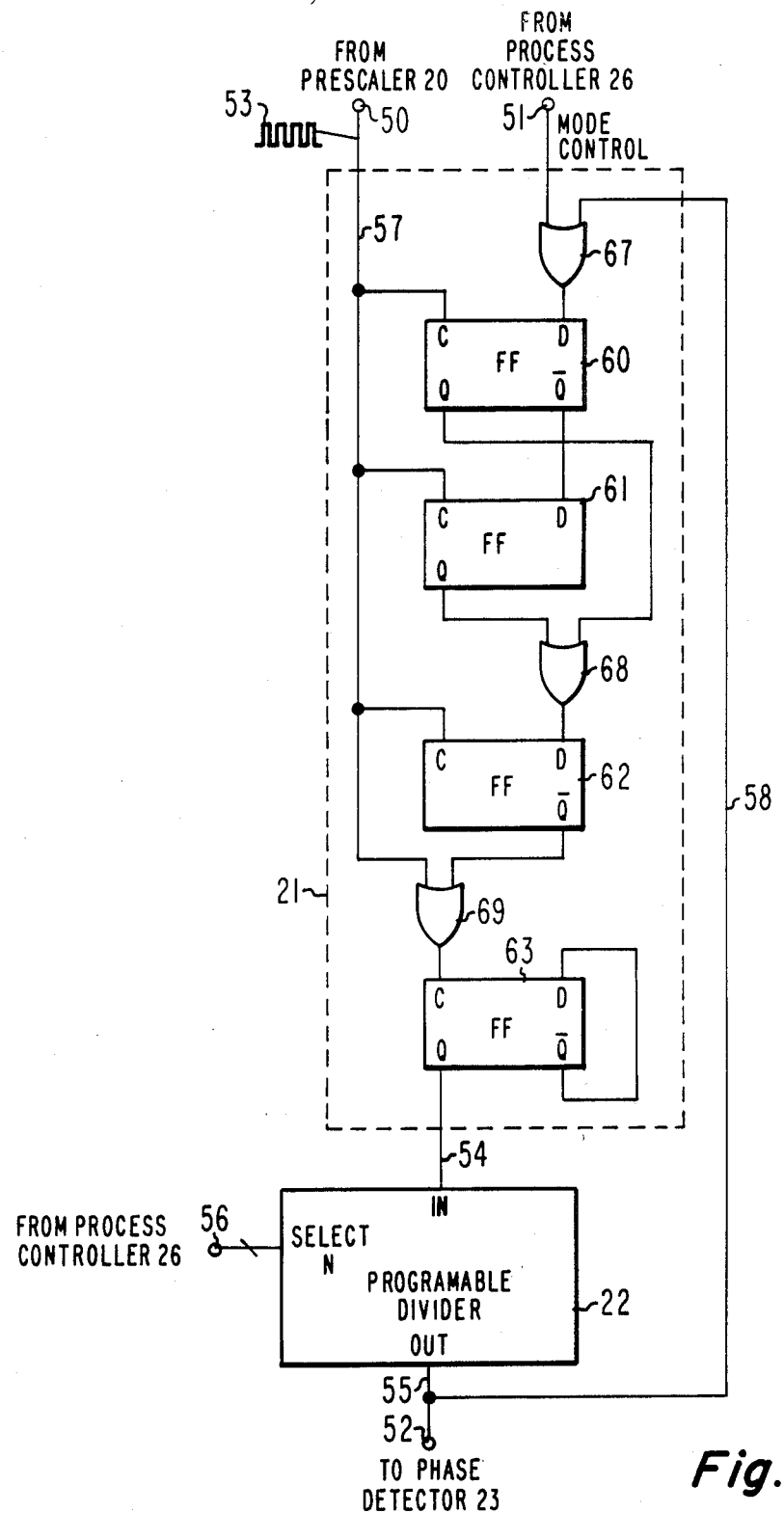
FIG. 3 is a detailed logic diagram of the fractional divider of the FIG. 2 embodiment.

Referring to FIG. 3, a detailed logic diagram of fractional divider 21 is shown in its relationship with programmable divider 22. Fractional divider 21 includes a first input terminal 50 for receiving a source of clock signals 53 from prescaler 20 (as shown in FIG. 2), and a second input terminal 51 for receiving a binary mode control signal, which is one of the FREQUENCY SELECT signals applied to programmable divider 22 by the frequency synthesis process controller 26 (as shown in FIG. 2). The output signal of fractional divider 21, on signal lead 54, is coupled to the IN terminal of programmable divider 22. The signal at the OUT terminal of divider 22 is coupled via signal lead 58 back into fractional divider 21, and via signal lead 55 to phase detector 23 (as shown in FIG. 2). A plurality of binary control signals applied at input terminals 56, and coupled to the SELECT N input terminals of programmable divider 22, are received from frequency synthesis process controller 26 and determine the division factor of programmable divider 22.

Clock signal 53 is coupled via signal lead 57 to the clock (C) input terminals of clocked flip-flop 60, 61 and 62, and to a first input terminal of OR gate 69, which output signal is coupled to the C input terminal of flip-flop 63. Flip-flops 60–63 may be, for example, of a type similar to the 11C06 750 MHz D-type, flip-flop, in the high speed ECL 11C00 series digital logic, sold by Fairchild Camera and Instruments Corp., Mountain View, Calif. It may be noted that the 11C06 flip-flops include OR functions at the data (D) and clock (C) inputs, functions shown separately for flip-flops 60, 62, and 63, for purposes of ease of understanding. Flip-flops 60–63 are assumed, in this example, to transfer the binary state of the signal applied at their D input terminals to the signal at their Q output terminals on the low-to-high ("0" to "1") transition of their clock signals.

The mode control signal from process controller 26 is coupled to a first input terminal of OR gate 67, and the output signal from programmable divider 22, on signal lead 58, is coupled to a second input terminal. The signal at the output terminal of OR gate 67 is applied to the D input terminal of flip-flop 60. The signal at the $\overline{Q}$ output terminal of flip-flop 60 is coupled to the D input terminal of flip-flop 61.

The signal at the Q output terminal of flip-flop 60 is coupled to a first input terminal of OR gate 68 and the signal at the Q output terminal of flip-flop 61 is coupled to a second input terminal of gate 68. The output signal of OR gate 68 is coupled to the D input terminal of flip-flop 62. The signal at the $\overline{Q}$ output terminal of flip-flop 62 is coupled to the second input terminal of OR gate 69 mentioned earlier.

Flip-flop 63 is configured in a toggle mode, that is, the signal at its $\overline{Q}$ output terminal is coupled back to its D input terminal, thus causing the signals at its Q and $\overline{Q}$ output terminals to change binary states on each low-to-high transition of the signal applied to its C input terminal.

Fractional divider 21 operates in one of two selectable modes, which modes are determined by the binary level of the signal applied at input terminal 51. In one mode, the frequency of the output signal of fractional divider 21, on signal lead 54, is one-half the frequency of the signal applied at input terminal 50. In the second mode, the frequency of the output signal on lead 54 is 1/(2+1/N) of the input signal frequency.

The first-mentioned mode of fractional divider 21, wherein the input signal frequency is divided in half, is effected by a high logic level signal, or a "1", applied at input terminal 51. This high level signal applied at one input of OR gate 67 causes the signal level at the D input terminal of flip-flop 60 to be always high. This results in steady high level signals at the Q output terminal of flip-flop 60 and at the D input terminal of flip-flop 62, and a steady low level signal at the input terminal of OR gate 69 which is coupled to the $\overline{Q}$ output terminal of flip-flop 62. The net effect is that OR gate 69 is always enabled to pass the clocking signals 53, applied at input terminal 50, to the C input terminal to toggle-configured flip-flop 63. Thus, the signal on signal lead 54 has a frequency which is one-half the clock signal 53 frequency when the mode control signal applied at input terminal 51 is high.

The second-mentioned mode of fractional divider 21, wherein the input signal frequency is divided by 2+1/N, is effected by a low logic level signal, or a "0", applied at input terminal 51. The operation in this mode is best understood with regard to the timing diagrams of FIG. 4.

At the outset, indicated as time $t_0$ in FIG. 4, the output signal of programmable divider 22, as shown in timing diagram (b), is in its low state, flip-flop 60 is reset (timing diagram (c)), and flip-flops 61 and 62 are set (timing diagrams (d) and (e)). Under these conditions, flip-flop 63 toggles on each positive-going edge of clock signal 53 (timing diagrams (a), (f) and (g)). Eventually, at time $t_1$, programmable divider 22, responsive at its IN terminal to a positive-going signal at the Q output terminal of flip-flop 63, causes its output signal on signal lead 55 to make a positive-going transition. This primes one input terminal of OR gate 67 and, on the next positive-going edge of clock signal 53 at time $t_2$, flip-flop 60 sets. On the next subsequent positive-going edge of clock signal 53 at time $t_3$, flip-flop 61 resets. Neither of these changes in flip-flops 60 and 61 affects the state of flip-flop 62, which remains set as long as either flip-flop 60 or 61 is set. Hence, clock signal 53 continues to be applied to the C input terminal of flip-flop 63 without any disturbing effect from OR gate 69.

Eventually, the signal on signal lead 54 causes the output signal from programmable divider 22 to go low as indicated at time $t_4$. On the next rising edge of clock signal 53 at time $t_5$, flip-flop 60 resets. On the next subsequent rising edge of clock signal 53 at time $t_6$, OR gate 68 sees low levels of the signals applied to both of its input terminals and flip-flop 62 is reset. This causes the signal level at the $\overline{Q}$ output terminal of flip-flop 62 to go high, holding the output signal of OR gate 69 at a high level. Hence the next subsequent rising edge of clock signal 53 at time $t_7$, which causes flip-flop 62 to set, is not propagated through OR gate 69 and flip-flop 63 fails to toggle on this one clock pulse. Following the setting of flip-flop 62, flip-flops 60–62 remain in their current states, just as they were at the beginning of the illustrated timing diagrams of FIG. 4, until the output signal of programmable divider 22 goes high.

It is therefore seen that fractional divider 21 provides, in its second-mentioned mode, a frequency division of its input clock signal 53 by a factor of two, and additionally drops one clock pulse each time it receives a high level input signal from programmable divider 22. Thus, for a programmed division value of N, fractional divider 21 receives 2N+1 pulses of clock signal 53. The total effect of dividers 21 and 22 on clock signal 53 having frequency f is to provide a periodic signal of frequency f/(2N+1).

Referring back to FIG. 2, attention is drawn to the FREQUENCY SELECT signals generated by process controller 26 and applied to the SELECT input terminals of programmable divider 22 and, via logic inverter 27, to the mode control input terminal of fractional divider 21. It will not be understood that the FREQUENCY SELECT signals may represent a binary-encoded value of division, and that the signal line associated with the least significant bit is coupled to inverter 27 and the balance of the FREQUENCY SELECT signals are applied to programmable divider 22. In this way, if the encoded value of the FREQUENCY SELECT signal is even, i.e., the LSB=0, then the MODE CONTROL signal applied to fractional divider 21 will be inverted by inverter 27 to a logic "1" and fractional divider 21 will perform a divide-by-two function. If, however, the encoded value of the FREQUENCY SELECT signal is odd, i.e., the LSB=1, then the MODE CONTROL signal will be a logic "1" and fractional divider 21 will perform a divide-by-(2+1/N) function, resulting in a net division by dividers 21 and 22 of 2N+1.

Other embodiments of the present invention will be apparent to those skilled in the art to which it pertains. The scope of this invention is not intended to be limited to the embodiment disclosed herein but should instead be gauged by the breadth of the claims which follow.

What is claimed is:

1. An apparatus responsive to an input clock signal of frequency f for generating periodic pulses of frequency f/(2N+1), where N is an integer, said apparatus comprising:

first divider means having an input terminal and an output terminal for providing at said output terminal a signal comprising periodic pulses at a frequency rate which is the Nth division of the frequency of a signal applied at said input terminal;

second divider means for generating an output signal of frequency f/(2+1/N), said second divider means including a divide-by-two circuit and an inhibiting circuit, said divide-by-two circuit having first and second input terminals and an output terminal, said divide-by-two circuit being responsive at said first input terminal thereof to particular transitions of said input clock signal for generating signal transitions at said divide by two circuit output terminal said inhibiting circuit being responsive to particular transitions of said signal comprising periodic pulses for generating inhibiting signal pulses, said divide-by-two circuit being responsive at said second input terminal thereof to said inhibiting signal, such that each of said inhibiting signal pulses prevents one of said particular transitions of said input clock signal from generating a signal transition at said output terminal of said divide-by-two circuit; and means for coupling said second divider means output signal to said first divider means input terminal.

2. The apparatus according to claim 1 wherein said first divider means includes frequency select input terminals whereby input signals applied to said frequency select input terminals selectably determine the value of N.

3. The apparatus according to claim 2 further including controller means coupled to said frequency select input terminals for providing said input signals thereto.

4. The apparatus according to claim 1 wherein said second divider means alternatively generates an output signal of frequency f/2, said apparatus consequently generating periodic pulses of frequency f/2N.

5. The apparatus according to claim 4 further including means coupled to said second divider means for selecting, as between f/(2N+1) and f/2N, the frequency of periodic pulses generated by said apparatus.

6. The apparatus according to claim 5 wherein said means for selecting the frequency of periodic pulses generated by said apparatus includes a process controller.

7. The apparatus according to claim 1 wherein said first divider is limited in its frequency response to signals applied to said input terminal, said first divider being unresponsive to signals of frequency f but responsive to signals of frequency f/2 and lower.

8. An apparatus responsive to a reference signal of a predetermined first frequency for providing an output signal of a second greater frequency, said apparatus comprising:

an oscillator having an input terminal and responsive to the voltage level thereat for generating said output signal of said second frequency;

means for dividing the frequency of said output signal by $2N+1$, where N is an integer;

means responsive to the phase difference between said frequency-divided output signal and said reference signal for generating a control signal; and means for coupling said control signal to said oscillator input terminal;

said dividing means comprising first and second dividers, said first divider having an input terminal and an output terminal for providing at said output terminal a signal comprising periodic pulses at a frequency rate which is the Nth division of the frequency of a signal applied at said input terminal of said first divider, said second divider generating a signal having a frequency which is said second frequency divided by $2+1/N$, said second divider including a divide-by-two circuit having first and second input terminals and an output terminal, said divide-by-two circuit being responsive at said first input terminal thereof to particular transitions of said output signal of said second frequency for generating signal transitions at said divide by two circuit output terminal, said second divider further including an inhibiting circuit responsive to particular transitions of said signal comprising periodic pulses for generating inhibiting signal pulses, said divide-by-two circuit being responsive at said second input terminal thereof to said inhibiting signal, such that each of said inhibiting signal pulses prevents one of said particular transitions of said output signal of said second frequency from generating a signal transition at said output terminal of said divide-by-two circuit;

said dividing means further comprising means for coupling the signal at said output terminal of said divide-by-two circuit to said first divider input terminal.

9. The apparatus according to claim 8 wherein said first divider includes frequency select input terminals whereby input signals applied to said frequency select input terminals selectably determine the value of N.

10. The apparatus according to claim 9 further including controller means coupled to said frequency select input terminals for providing said input signals thereto.

11. The apparatus according to claim 8 wherein said second divider alternatively generates a signal having frequency which is said second frequency divided by two, said means for dividing consequently dividing the frequency of said output signal by 2N.

12. The apparatus according to claim 11 further including means coupled to said second divider for selecting, as between $2N+1$ and 2N, the division factor of said dividing means.

13. The apparatus according to claim 12 wherein said means for selecting the division factor of said dividing means includes a process controller.

14. The apparatus according to claim 8 wherein said first divider is limited in its frequency response to signals applied to said input terminal, said first divider being unresponsive to signals of said second frequency but responsive to signals of frequency equal to or less than said second frequency divided by two.

* * * * *